United States Patent
Yao

(10) Patent No.: US 7,067,853 B1
(45) Date of Patent: Jun. 27, 2006

(54) IMAGE INTENSIFIER USING HIGH-SENSITIVITY HIGH-RESOLUTION PHOTODETECTOR ARRAY

(76) Inventor: Jie Yao, 43 York Dr., Princeton, NJ (US) 08540

( * ) Notice: Subject to any disclaimer, the term of this patent is extended or adjusted under 35 U.S.C. 154(b) by 130 days.

(21) Appl. No.: 10/907,090

(22) Filed: Mar. 18, 2005

Related U.S. Application Data

(60) Provisional application No. 60/604,566, filed on Aug. 26, 2004.

(51) Int. Cl.
*H01L 31/0328* (2006.01)
*H01L 31/0336* (2006.01)
*H01L 31/072* (2006.01)
*H01L 31/109* (2006.01)

(52) U.S. Cl. .................. 257/184; 257/187; 257/443; 257/447

(58) Field of Classification Search ............ None
See application file for complete search history.

(56) References Cited

U.S. PATENT DOCUMENTS

| | | | |
|---|---|---|---|
| 5,014,096 A | 5/1991 | Matsuda et al. | |
| 6,037,643 A | 3/2000 | Knee | |
| 6,667,498 B1 * | 12/2003 | Makimoto et al. | 257/183 |

OTHER PUBLICATIONS

J.-P. Vilcot, et al., "Edge-coupled InGaAs/InP phototransistors for microwave radio fibre links", 1997 Workshop on High Performance Electron Devices for Microwave and Optoelectronic Applications, pp. 163-168, Nov. 24-25, 1997.

M.C. Brain, and D.R. Smith, "Phototransistors in digital optical communication systems", IEEE Journal of Quantum Electronics, vol. QE-19, No. 6, pp. 1139-1148, 1983.

Heinz Beneking, N.Grote, W.Roth, and M.N. Svilans, "GaAs-GaAlAs phototransistor/laser light amplifier", Electron. Lett. (16),602, 1980.

Heinz Beneking, N. Grote, and M.N. Svilans, "Monolithic GaAlAs/GaAs infrared-to-visible wavelength converter with optical amplification", IEEE Trans. Electron, Devices ED-28, 404, 1981.

C.Y.Chen, A.Y.Cho, P.A.Garbinski, C.G.Bethea, and B.F. Levine, "Modulated barrier photodiode: A new majority-carrier photodetector", Applied Physics Letters, 39(4), 340-342, 1981.

J.C.Campbell, "Phototransistors for Lightwave Communications", Chapter 5 of "Lightwave Communication Technology" Part D "Photodetectors", Semiconductors and Semimetals edited by R.K. Willardson & Albert C. Beer: vol. 22 Lightwave Communication Technology edited by W.T. Tsang; Academic Press, 1985.

Weidong Zhou, et al., "Low-power phototransceiver arrays with vertically integrated resonant-cavity LEDs and heterostructure phototransistors", IEEE Photonics Technology Letters, vol. 13, Issue 11, pp. 1218-1220, Nov. 2001.

(Continued)

*Primary Examiner*—Tu-Tu Ho

(57) ABSTRACT

This invention discloses the design of a semiconductor-based image intensifier chip and its constituent photodetector array device based on sidewall-passivated mesa heterojunction phototransistors (HPTs).

22 Claims, 9 Drawing Sheets

OTHER PUBLICATIONS

O.Qasaimeh, et al., "Monolithically integrated low-power phototransceivers for optoelectronic parallel sensing and processing applications", Journal of Lightwave Technology, vol. 19, Issue 4, pp. 546-552, Apr. 2001.

O.Qasaimeh, et al., "Monolithically integrated low-power phototransceiver incorporating microcavity LEDs and multiquantum-well phototransistors", IEEE Photonics Technology Letters, vol. 12, Issue 12, pp. 1683-1685, Dec. 2000.

O.Qasaimeh, et al., "Ultra-low power monolithically integrated InGaAs/GaAs phototransceiver incorporating a modulated barrier photodiode and a quantum dot microcavity LED", Lasers and Electro-Optics Society 2000 Annual Meeting. LEOS 2000. 13th IEEE Annual Meeting. vol. 1, pp. 285-286, Nov. 13-16, 2000.

S.-W.Tan, et al., "Characterization and Modeling of Three-Terminal Heterojunction Phototransistors Using an InGaP Layer for Passivation", Electron Devices, IEEE Transactions on , vol.: 52 , Issue: 2 , pp. 204-210, Feb. 2005.

Der-Feng Guo, "Optoelectronic switch performance in double heterostructure emitter bipolar transistor", Solid-State Electronics, vol. 45, pp. 1179-1182, 2001.

M.Shishikura, et al., "A symmetric double-core InGaAlAs waveguide photodiode for hybrid integration on optical platforms", IEEE Lasers and Electro-Optics Society Annual Meeting, 1996. vol. 1, pp. 12-13, Nov. 18-19, 1996, Boston, MA U.S.A.

M.Shishikura, et al., "Highly reliable operation of InGaAlAs mesa-waveguide photodiodes in a humid ambient", 11th Int'l Conf. on Integrated Optics and Optical Fibre Communications and 23rd European Conf. on Optical Communications, vol. 4, pp. 97-100, Sep. 22-25, 1997.

T.Chino, K.Matsuda, H.Adachi, J.Shibata, "Characteristics of photonic parallel memory in relation to fabrication process", IEE Proceedings J. Optoelectronics, vol. 138, Issue 2, pp. 128-132, Apr. 1991.

T.Chino, H.Adachi, K.Matsuda, "A photonic parallel memory with air-bridge interconnections for large scale integration", IEEE Photonics Technology Letters, vol. 5, Issue 5, pp. 548-551, May 1993.

Ying Huang, R.I.Hornsey, "Current-mode CMOS image sensor using lateral bipolar phototransistors", IEEE Transactions on Electron Devices, vol. 50, Issue 12, pp. 2570-2573, Dec. 2003.

* cited by examiner

FIGURE 3

|  | HPT:<br>Layer | Material | Thickness | Doping(cm^-3) |
|---|---|---|---|---|
| 310 | cap | GaAs | 300 nm | n, 2e19 |
|  | emi | InGaP | 250 nm | n, 2e18 |
| 340 | emi-eb | InGaP | 50 nm | undoped |
|  | bas-eb | GaAs | 50 nm | undoped |
| 320 | bas | GaAs | 65 nm | p, 2e17 |
| 350 | abs-bc | GaAs | 2,500 nm | undoped |
| 330 | col | GaAs | 50 nm | n, 1e18 |
|  | scol | GaAs | 1,000 nm | n, 1e18 |
| 360 | etchstop | InGaP | 50 nm | n, 1e18 |
| 370 | buffer | GaAs | 0 ~ 3,000 nm | n, 1e18 |
|  | substrate | GaAs | 375,000 nm | n-doped |

FIGURE 4

HPT:

| Layer | Material | Thickness | Doping(cm^-3) |
|---|---|---|---|
| 310 { cap | InGaAs | 300 nm | n, 2e19 |
| 310 { emi | InP | 250 nm | n, 2e18 |
| 340 { emi-eb | InP | 50 nm | undoped |
| 340 { bas-eb | InGaAs | 50 nm | undoped |
| 320 { bas | InGaAs | 65 nm | p, 2e17 |
| 350 { abs-bc | InGaAs | 2,500 nm | undoped |
| 330 { col | InGaAs | 50 nm | n, 1e18 |
| 330 { scol | InP | 1,000 nm | n, 1e18 |
| 360 { etchstop | InAlAs | 50 nm | n, 1e18 |
| 370 { buffer | InP | 0 ~ 3,000 nm | n, 1e18 |
| 370 { substrate | InP | 375,000 nm | n-doped |

IMAGE INTENSIFIER USING
HIGH-SENSITIVITY HIGH-RESOLUTION
PHOTODETECTOR ARRAY

CROSS-REFERENCE TO RELATED
APPLICATIONS

This application claims priority of U.S. Provisional Patent Application No. 60/604,566 filed on Aug. 26th of 2004, entitled "Image intensifier using high-sensitivity high-resolution photodetector array made by precision flip-chip bonding method".

FIELD OF THE INVENTION

This invention relates to phototransistor-based photodetector arrays, to image intensifiers, and to semiconductor devices in general.

BACKGROUND OF THE INVENTION

Due to their technological importance and social economic value, semiconductor photodetectors and image intensifiers have been studied and widely used for more than half a century. Listed below are references immediately relevant to this invention:

J.-P. Vilcot, V. Magnin, J. Van de Casteele, J. Harari, J.-P. Gouy, B. Bellini, D. Decoster, Workshop on High Performance Electron Devices for Microwave and Optoelectronic Applications, pp. 163–168, Nov. 24–25, 1997.

M. C. Brain, and D. R. Smith, "Phototransistors in digital optical communication systems", IEEE Journal of Quantum Electronics, Vol. QE-19, No. 6, pp. 1139–1148, 1983.

Heinz Beneking, N. Grote, W. Roth, and M. N. Svilans, Electron. Lett. (16), 602, 1980.

Heinz Beneking, N. Grote, and M. N. Svilans, IEEE Trans. Electron. Devices ED-28, 404, 1981.

C. Y. Chen, A. Y. Cho, P. A. Garbinski, C. G. Bethea, and B. F. Levine, "Modulated barrier photodiode: A new majority-carrier photodetector", Applied Physics Letters, 39(4), 340–342, 1981.

SEMICONDUCTORS AND SEMIMETALS edited by R. K. Willardson & Albert C. Beer; Volume 22 *Lightwave Communication Technology* edited by W. T. Tsang; Part D Photodetectors Academic Press, 1985; Chapter 5 *Phototransistors for Lightwave Communications* by J. C. Campbell.

Weidong Zhou, S. Pradhan, P. Bhattacharya, W. K. Liu, D. Lubyshev, "Low-power phototransceiver arrays with vertically integrated resonant-cavity LEDs and heterostructure phototransistors", IEEE Photonics Technology Letters, Vol. 13, Issue 11, pp. 1218–1220, Nov. 2001.

O. Qasaimeh, W. Zhou, P. Bhattacharya, D. Huffaker, D. G. Deppe, "Monolithically integrated low-power phototransceivers for optoelectronic parallel sensing and processing applications", Journal of Lightwave Technology, Vol. 19, Issue 4, pp. 546–552, April 2001.

O. Qasaimeh, Weidong Zhou, P. Bhattacharya, D. Huffaker, D. Deppe, "Monolithically integrated low-power phototransceiver incorporating microcavity LEDs and multi-quantum-well phototransistors", IEEE Photonics Technology Letters, Vol. 12, Issue 12, pp. 1683–1685, Dec. 2000.

O. Qasaimeh, W. Zhou, P. Bhattacharya, D. Huffaker, D. Deppe, "Ultra-low power monolithically integrated InGaAs/GaAs phototransceiver incorporating a modulated barrier photodiode and a quantum dot microcavity LED", Lasers and Electro-Optics Society 2000 Annual Meeting. LEOS 2000. 13th IEEE Annual Meeting. Vol. 1, pp. 285–286, 13–16 Nov. 2000.

S.-W. Tan, H.-R. Chen, W.-T. Chen, M.-K. Hsu, A.-H. Lin, W.-S. Lour, "Characterization and Modeling of Three-Terminal Heterojunction Phototransistors Using an InGaP Layer for Passivation", Electron Devices, IEEE Transactions on, Volume: 52, Issue: 2, pp. 204–210, February 2005.

Der-Feng Guo, "Optoelectronic switch performance in double heterostructure emitter bipolar transistor", Solid-State Electronics, Vol. 45, pp. 1 179–1 182, 2001.

M. Shishikura, I. Nakamura, S. Tanaka, Y. Matsuoka, T. Ono, T. Miyazaki, and S. Tsuji, "A symmetric double-core InGaAlAs waveguide photodiode for hybrid integration on optical platforms", IEEE Lasers and Electro-Optics Society Annual Meeting, 1996. Volume 1, pp. 12–13, Nov. 1 8–19, 1996, Boston, Mass. U.S.A.

M. Shishikura, S. Tanaka, H. Nakamura, Y. Matsuoka, S. Kikuchi, K. Nagatsuma, R. Sudo, T. Miura, T. Ono, and S. Tsuji, "Highly reliable operation of InGaAlAs mesa-waveguide photodiodes in a humid ambient", 11th International Conference on Integrated Optics and Optical Fibre Communications and 23rd European Conference on Optical Communications (Conf. Publ. No.: 448), Vol. 4, pp. 97–100, Sep. 22–25, 1997.

T. Chino, K. Matsuda, H. Adachi, J. Shibata, "Characteristics of photonic parallel memory in relation to fabrication process", IEE Proceedings J. Optoelectronics, Vol. 138, Issue 2, pp. 128–132, April 1991.

T. Chino, H. Adachi, K. Matsuda, "A photonic parallel memory with air-bridge interconnections for large scale integration", IEEE Photonics Technology Letters, Vol. 5, Issue 5, pp. 548–551, May 1993.

Kenichi Matsuda, Jun Shibata, "Optoelectronic integrated circuit with optical gate device and phototransistor", U.S. Pat. No. 5,014,096, filed on Feb. 1st, 1990 and issued on May 7th, 1991.

Ying Huang, R. I. Hornsey, "Current-mode CMOS image sensor using lateral bipolar phototransistors", IEEE Transactions on Electron Devices, Vol. 50, Issue 12, pp. 2570–2573, December 2003.

Derek L. Knee, "Photocell layout for high-speed optical navigation microchips", U.S. Pat. No. 6,037,643, filed Feb. 17th, 1998 and issued Mar. 14th, 2000.

Jie Yao, "High-sensitivity high-resolution photodetector array", U.S. patent provisional application No. 60/476,922 filed on Jun. 9, 2003.

With applications in military night vision, medical imaging, security and law enforcement, etc., image intensifiers amplify light, turning faint low-contrast images into bright high-contrast ones. Despite the first use of military night vision equipment during World War II, it has been a 50-year dream of the military to gain significant nighttime battlefield advantage by equipping each and every combatant with night vision goggles, the core of which is the image intensifier technology. The semiconductor image intensifier disclosed in this invention is expected to deliver such high performance as well as low cost to ultimately reach that goal.

At present, Delft Electronic Products, ITT and Northrop-Grumman make the best image intensifiers supplying the European Union and the United States, respectively. Using a hybrid of semiconductor and vacuum tube technologies, these image intensifier tubes provide adequate brightness enhancement, but suffer from limited view angle, from mechanical fragileness, from short operating lifetime and from high manufacturing cost. All these drawbacks are typical of vacuum tube technology, calling for a completely semiconductor solution with performance matching or exceeding that of the current hybrid image intensifier tubes. The U.S. Defense Advanced Research Program Agency (DARPA) has solicited such solutions for several times over the past few decades, with the latest such contract being awarded in the year of 2004. Such a semiconductor image intensifier shall also find applications in medical imaging, law enforcement and security, etc. This invention presents such a design of semiconductor image intensifier, the core component of which is the surface-passivated mesa-structure heterojunction-phototransistors (HPTs).

HPTs have been studied for potential applications in high-speed fiber-optic communication networks. The paper by J.-P. Vilcot et al. (1997) and the paper by M. C. Brain and D. R. Smith (1983) report such comprehensive studies. HPTs optimized for this application have high bandwidth, typically in the GHz (Giga-Hertz) range, but allow high dark currents, typically in the nA (nano-Ampere) range, and allow high bias currents. The high dark current and high bias current render these HPTs unsuitable for use in image intensifiers, which always require dark currents in the pA (pico-Ampere) range or lower, and which also benefit from zero bias current while maintaining gain well above 1,000. Consequently, HPTs optimized for fiber-optic communications are typically not adequate for image intensifiers.

H. Beneking et al. reported one of the earliest attempts to use HPT in GaAs material system for image intensification with limited success. Their work was carried out at a time when semiconductor bulk material quality was still improving, and when surface problems and surface passivation have yet to be explored. Beneking et al. built a semiconductor image intensifier with phototransistors of planar structures. The entire image intensifier device was successful as optical amplifier and as an infrared-to-visible wavelength converter at least for normal light levels. Planar structures do not have mesas or isolation trenches, thus completely eliminating mesa sidewalls and their passivation. However, the tradeoff is large crosstalk over lateral distances of 25 to 100 microns, mainly because of carrier diffusion. This crosstalk in planar HPTs smears out image points 25 microns or closer. This invention solves the crosstalk problem with passivated mesa HPTs defined by their surrounding isolation trenches.

During the same years, C. Y. Chen et al. proposed a novel modulated-barrier-photodiode. Just as reviewed by J. C. Campbell in *SEMICONDUCTORS AND SEMIMETALS*, it is a phototransistor with base width pushed to the extreme. In both literatures, two groups of authors independently experimented with phototransistors. Gain exceeded 1000 in GaAs at very low light levels of 1 nW with mesa structures larger than 100 microns in lateral dimensions. Neither surface issues nor surface passivation techniques have been mentioned. Mesa sidewalls, if not passivated, will lead to high dark current and significantly reduced small signal gain in HPTs with lateral dimensions smaller than 25 microns, the carrier diffusion length. This invention teaches that mesa isolation trenches solve the inter-pixel crosstalk problem, and that mesa sidewall passivation leads to high small signal gain and low dark current.

The latest papers by P. Bhattacharya et al. report no sidewall passivation of their HPTs, thus limiting their dark current to 1 nA or higher, and limiting their HPT size to 30 microns or larger. It is worth noting that S. W. Tan et al. used the word passivation for ledge passivation, a very successful standard technique widely used in the HBT electronics industry, for their mesa HPTs 150 microns in lateral size. No sidewall surface passivation was mentioned at all. In order to reduce HPT mesa size to well below 25 microns and facilitate large-scale integration of mesa HPTs, the passivation of mesa sidewalls is crucial. Successful passivation of HPT mesa sidewalls prevents small signal gain reduction as well as reduces dark current.

Silicon nitride has been reported by M. Shishikura et al. to passivate p-i-n photodiodes in the InP material system with high reliability. For a simple p-i-n photodiode, the passivation of sidewall surface serves only to reduce dark current. No gain mechanism is involved. This invention, in contrast, teaches several different inorganic passivation materials and techniques aimed at achieving high gain for HPT as well as reducing dark current to pA or below.

Organic passivation materials, for example, result in >20,000 nA of bias current and >10 nA of dark current for bi-stable switch digital memory devices reported by T. Chino et al. (1991). While these might be great results for digital switches, they are certainly totally unacceptable for image intensifier applications. Hence this invention does not cover organic passivation materials at all.

Years later, T. Chino et al. (1993) attributed their lowest holding current of 6,000 nA to unintentionally and atmospherically formed indium oxide (In2O3) on the exposed surfaces of InP-based semiconductors, essentially eliminating the need for surface passivation for the digital logic large-signal (micro-Watt) operation of the HPT-LED pair. However, In2O3 is typically not an insulator but a conductor, shorting instead of passivating their HPT sidewalls, and leading to unacceptably high currents for image intensifier applications with input analog optical signals at pico-Watt or lower optical power. This invention insists the passivation of HPT sidewall with an electrical insulator.

With sidewall-passivated mesa HPTs described in this invention, one can simultaneously achieve pixel sizes well below 10 microns, trench isolation, amplifier gain well above 1,000 at low illumination levels, and dark current in the pA range or below.

Other device structures not covered by this invention are possible for imaging. Ying Huang et al. reported one such example, where the planar device is readily compatible with CMOS technology, but has a low fill factor for optical absorption. In contrast, the mesa HPTs described in this invention provide a means of vertically integrating amplification function with photodetection function, maximizing fill factor.

The preferred layout of this invention requires the HBT amplifier not to be at equal distance from the geometric centers of neighboring HPTs, opposite to the teaching in U.S. Pat. No. 6,037,643 by Derek L. Knee.

In a preferred embodiment of this invention, the semiconductor image intensifier is composed of two semiconductor chips flip-chip bonded into one device, the first chip being the GaAs-based HPT or photo-Darlington array, and the second chip being the GaN-based LED array.

It is worth noting that the high-gain low-noise amplification is performed in the electrical domain with a current amplifier, which is preceded by the optical-to-electrical conversion at the photo-detector and followed by the reverse electrical-to-optical conversion at the LED. Can we use direct optical-to-optical amplification instead? While we have numerous mature mass-produced devices and circuits capable of high-gain low-noise amplification in the pure electrical domain, the current electro-optical technologies do not allow efficient high-gain amplification in the pure optical domain. With the availability of highly efficient photodetectors, electrical amplifiers and LEDs, we choose the much more practical path of electrical amplification for our image intensifier.

One of the critical components of the semiconductor image intensifier described in this invention is the optical isolation layer. Without the optical isolation materials between the LED-based display array and the HPT-based photodetector array, the output analog signal from the LED will partially enter the HPT, forming in a positive-feedback loop, which can result in undesirable strong non-linearity in the transfer function (from input to output) of the image intensifier.

One example of such non-linearity is the switching bi-stability reported by T. Chino et al. in their HPT-LED pair, which is designed for switching and intended for use in digital photonic parallel memory devices. Switching, however, is absolutely intolerable in the analog-signal image intensifier. Also, the image intensifier disclosed in this invention operates at low input light levels in the pico-Watt ($10^{-12}$ Watt) range per pixel, while the digital memory devices reported by T. Chino et al. operate at a minimum of 1 micro-Watt ($10^{-6}$ Watt) of optical power generated by the 10 micro-Amperes of holding current through the LED. In fact, image intensifiers are optimized for the low-light limit, while digital memory avoid low signal levels due to the difficulties associated with noise, crosstalk, compatibility with other circuits, etc. As a result, no surface passivation is needed for the digital logic large-signal (micro-Watt) operation of the HPT-LED pair reported by T. Chino et al., whereas excellent surface passivation is absolutely indispensable for the analog small-signal (pico-Watt) operation of the image intensifier described in this invention. Unintentionally and atmospherically formed on the exposed surfaces of InP-based semiconductors as reported by T. Chino et al., indium oxide (In2O3) is typically not an insulator but a conductor, shorting instead of passivating their HPT sidewalls.

Having examined device performance, we now go on to the device design and device structure. FIG. 2 of the 1991 paper by T. Chino et al. shows the working mechanism of their HPT-LED memory device. For the off state of their HPT-LED switch to be stable, the slope $dI/dP_{FB}$ of the current I versus optical feedback power $P_{FB}$ curve (the l-$P_{FB}$ curve) in the low current and low optical power region has to be larger for the LED than for the HPT. If anyone were to use this region for an image intensifier, however, one would get reduction, instead of intensification, of image brightness even with complete suppression of optical feedback from the LED to the HPT. In contrast, the opposite is required of an image intensifier, which typically delivers the largest gain and amplification in the low optical power region. In fact, the above-mentioned characteristics of $dI/dP_{FB}$ being larger in LED than in HPT is one important result of the damaged mesa sidewalls both for the LED and for the HPT. With ideal damage-free mesa sidewalls, $dI/dP_{FB}$ of the HPT is almost always a lot higher than $dI/dP_{FB}$ of LED. Damages in the mesa sidewalls of an LED increase its $dI/dP_{FB}$, while damages in the mesa sidewalls of an HPT decreases its $dI/dP_{FB}$. That is why T. Chino et al. wrote in paragraph 3.3 of their 1991 paper that their "switches need plasma damage to the sidewalls of mesa to some degree to show bistability". None of their switches formed by wet chemical etching exhibited bistability, because these switches were "near the ideal surface condition" (paragraph 3.2 of their 1991 paper). The surface processing techniques reported by T. Chino et al. result in a mesa sidewall with more damages than the wet-etched case, with holding currents in the 10,000 nA range and dark leakage currents in the 10 nA range. In contrast, this invention teaches the opposite. In order to achieve dark leakage currents in the pA (pico-Ampere, namely 1/1000 nA) range or lower, we passivate the mesa sidewalls to reduce the damage on the typically wet-etched sidewalls, resulting in mesa sidewall surfaces of higher quality than the purely wet-etched case. This invention maintains high dI/dP for the HPT and high dP/dI for the LED, and hence, with the suppression of optical feedback, makes the image intensifier optimized for low input optical power.

The HPT combines the functionality of a p-i-n photodiode with that of a HBT. Hence the HPT is neither simply a p-i-n photodiode nor simply an HBT. In fact, the HPT disclosed in this invention is optimized very differently from that of an HBT. An HBT is definitely always a three-terminal device with contacts to the base layer, while the HPT disclosed in this invention is preferred to be a two-terminal device with floating base. A high-speed HBT typically has heavy base doping levels of $10^{(+19)}/cm^3$ or higher for the reduction of base resistance, while the HPT disclosed in this invention is preferred to have low base doping of $2*10^{(+17)}/cm^3$. HBTs almost never need to operate at base currents as low as pico-Amperes in a 50-Ohm microwave system, while the HPT disclosed in this invention typically operates at pico-Amperes of equivalent base current if not lower. Consequently, the passivation target and the passivation techniques are also very different. The most effective surface passivation technique for an HBT is ledge passivation on top of the base layer, as studied by numerous investigators including S. W. Tan et al. and Der-Feng Guo, while the HPT disclosed in this invention employs sidewall passivation using inorganic insulators. The sidewall passivation according to this invention simultaneously suppresses dark current and maintains high current gain. In the preferred embodiment of this invention, there is no place for ledge passivation in the two-terminal HPT at all. In short, HPTs and HBTs are optimized very differently, without too many optimization techniques in common.

This invention describes the optimization techniques for a mesa HPT array uniquely developed for image intensifier applications.

This invention was first filed on Jun. 9, 2003 as U.S. patent provisional application No. 60/476,922 under the title of "High-sensitivity high-resolution photodetector array", wherein more details are available.

SUMMARY OF THE INVENTION

This invention describes, in general, a semiconductor photodetector array device with each pixel containing at least one sidewall-passivated mesa heterojunction phototransistor (HPT).

In the most preferred embodiment, the photodetector array based on sidewall-passivated mesa-structure HPTs has the following characteristics. (a) It uses Al2O3, AlN, Si3N4, SiO2, or other inorganic material for sidewall surface passivation. (b) It has high fill factor. (c) Pixel size is around several microns. (d) The HPT is a two-terminal device with floating base. (e) The HPT can be followed by a heterojunction bipolar transistor (HBT) to form a photo-Darlington pair for high amplification gain, with the HBT and the HPT sharing the same epitaxial layers. (f) The active base doping level of HPT is $10^{(+18)}/cm^3$ or *lower*, and the base width is 1000 Angstroms or lower. (g) The HPT (and HBT) mesas are rectangles with their sides along the (100) and (010) directions, or along the (110) and (1$\bar{1}$0) directions. (h) The substrate is thinned to several microns, if the substrate material is not transparent to the detection spectrum, as is the case for using GaAs substrate for visible light.

This invention also describes, in general, an image intensifier chip consisting of the above-mentioned HPT-based photodetector array and a display array containing light emitting diodes (LEDs), where the two arrays are flip-chip bonded together with optical isolation materials capable of reflecting or absorbing light sandwiched in between.

In the most preferred embodiment, the above-mentioned image intensifier chip uses GaN-based micron-LED array for display. The image intensifier chip is used as a two-dimensional focal plane array (FPA), with the photodetector array positioned at the focal plane of the object lens and the LED array positioned at the focal plane of the eyepiece. Since the distance between the photodetector array and the LED array flip-chip bonded in the same image intensifier chip is typically less than 10 microns, they can be viewed as overlapping each other for the optics and packaging of the image intensifier device. The entire image intensifier chip sits at the focal plane of both the object lens and the eyepiece.

The same design concept can be readily extended to a device containing both the HPT-based photodetector array and an electrical readout circuit flip-chip bonded together. No optical isolation material is needed between the two arrays in this case.

BRIEF DESCRIPTION OF THE DRAWINGS

FIG. 3: HPT epitaxial structure in GaAs-based semiconductor materials system.

FIG. 4: HPT epitaxial structure in InP-based semiconductor materials system.

FIG. 7: Image intensifier structure containing passivated mesa HPT, LED and optical isolation in between.

DETAILED DESCRIPTION

In the preferred embodiment of this invention, one can make a semiconductor image intensifier using one of the designs outlined as follows. Only the simplest design is presented to demonstrate the design concepts.

Depending on the optical power amplification, namely, image brightness enhancement factor, we can choose single HPT photodetector array shown in FIG. 1 for optical gain below 500, or choose photo-Darlington array shown in FIG. 2 for optical gain between 200 and 1,000,000. In both cases, it is strongly preferred to have the HPT as a two-terminal device with its base floating. The floating base design for HPT significantly simplifies device structure and eases thermal budget. However, it puts stringent requirements on small-signal gain at zero bias current, which is determined mainly by epitaxial growth quality and by sidewall passivation explained below.

Figure 1:
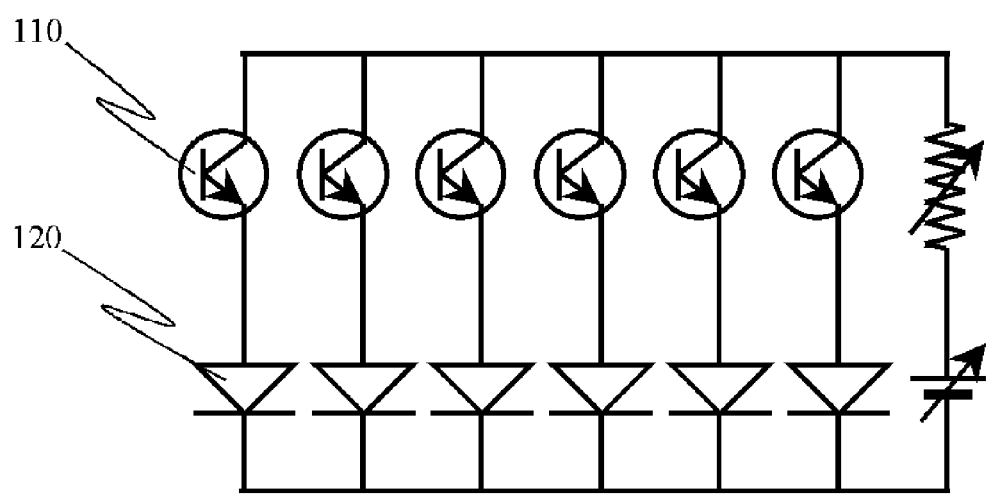
FIG. 1: Image intensifier circuit with pixels of single HPTs and LEDs. Not shown is the optical isolation between HPT and LED.
Figure 2:
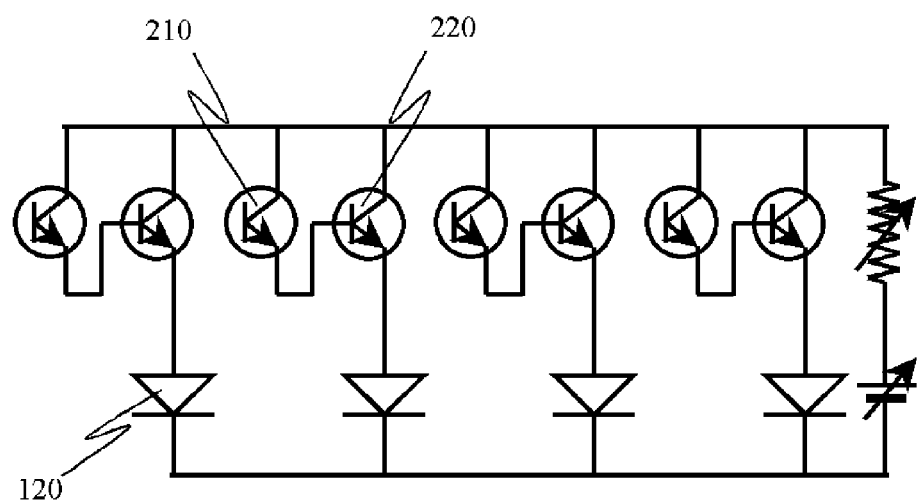
FIG. 2: Image intensifier circuit with pixels of photo-Darlingtons and LEDs. Not shown is the optical isolation between photo-Darlington and LED.

In FIG. 1, the output current of the HPT 110 directly drives the flip-chip bonded LED 120, whereas in FIG. 2, the HPT 210 and the HBT 220 form a photo-Darlington pair to drive the flip-chip bonded LED 120.

The preferred epitaxial structure of the HPT array is shown in FIG. 3 in GaAs-based semiconductor materials system, and shown in FIG. 4 in InP-based semiconductor materials system. It should be noted that the active base doping level is about $2\times10^{(+17)}/cm\hat{a}3$ (two times ten to the seventeenth per cubic centimeter) for highest HPT gain, and that the base width is about 65 nm. It should also be noted that, in the case of photo-Darlington, the HPT and the HBT share the same epitaxial layers.

Despite the difference in semiconductor material systems, the epitaxial structures in the preferred embodiments of the HPT in FIGS. 3 and 4 are very similar. Layers 310 less the depletion region near intrinsic emitter junction 340 form the emitter and its contact cap; layer 320 less both the depletion region near the intrinsic emitter junction 340 and the depletion region near the intrinsic collector junction 350 forms the base; and layers 330 less the depletion region near the intrinsic collector junction 350 form the collector of the HPT. Intrinsic layers 340 plus the depletion regions in 310 and in 320 form the emitter junction; and intrinsic layer 350 plus the depletion regions in 320 and in 330 forms the collector junction. The etch-stop layer 360 facilitates the wet chemical removal of the buffer and the substrate layers 370, if necessary.

Note that base width is defined throughout this invention as the thickness of layer 320 less the depletion region near the intrinsic emitter junction 340 and the depletion region near the intrinsic collector junction 350. It should range from 0 to 1000 Angstroms in the preferred embodiment of this invention. The doping in the base 320 does not have to be uniform.

In order to reduce pixel size to well below the natural crosstalk distance of around 25 microns, the carrier diffusion length, we need to define mesas by etching isolation trenches surrounding each HPT as well as each HBT in the photo-Darlington case.

One of the most important teachings in this invention is the surface passivation of mesa sidewalls. Surface problems and the need for surface passivation are common to most III–V semiconductors. GaAs and InP, the two most mature III–V semiconductors, however, have very different surface properties. The unpassivated GaAs has surface Fermi level pinned within the band gap, leading to surface depletion, while the unpassivated InP has surface Fermi level pinned within the conduction band, leading to surface accumulation or surface inversion. InP surface contributes significantly to photodiode dark current through the surface accumulation or surface inversion region, whereas GaAs surface contributes significantly to transistor gain reduction. One of the core designs taught in this invention is the solution of this surface problem by means of sidewall passivation.

The sidewalls of both the HPT and the HBT are preferably passivated by Al2O3, AlN, Si3N4, SiO2, or any other electrically insulating inorganic passivation materials. Passivation material is defined as the insulator or semiconductor in direct physical contact with the HPT mesa sidewall surface, simultaneously covering the base, the emitter junction and the collector junction of the passivated HPT or HBT. Both organic and inorganic materials can exist on top of the passivation material. The passivation process typically includes surface pre-cleaning, insulator formation or deposition and thermal annealing. The resulting structures are shown in FIGS. 5 and 6 for the single-HPT pixel and for the photo-Darlington pixel, respectively.

Figure 5:
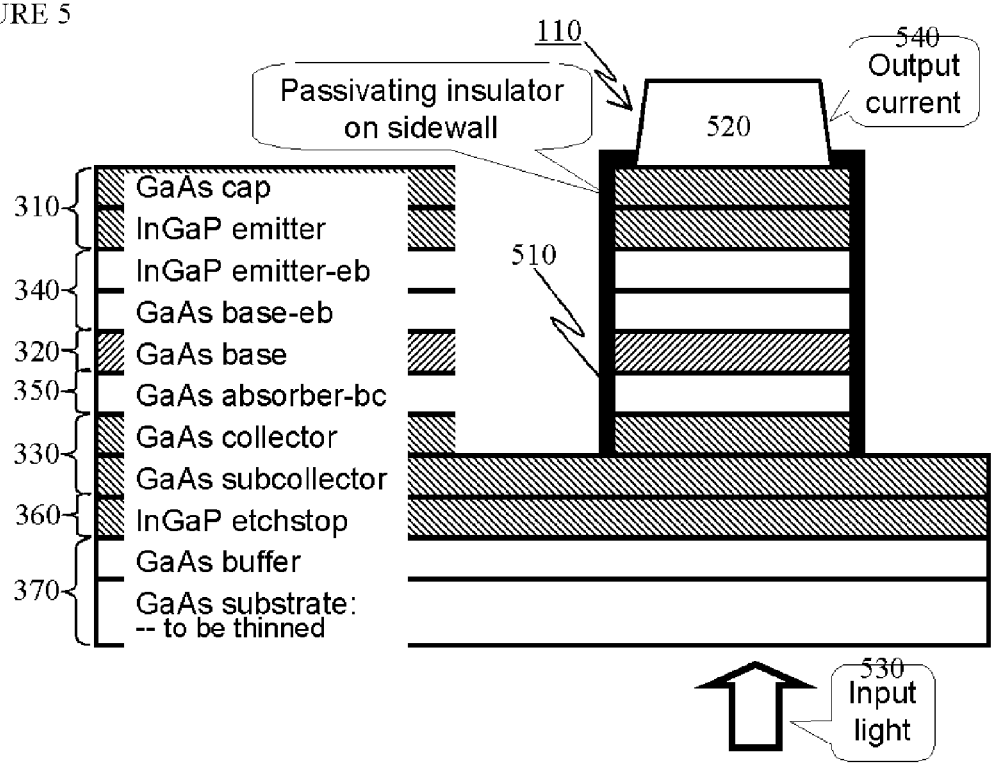
FIG. 5: Cross section of a single-HPT pixel with sidewall-passivated mesa structure shown at the right, and epitaxial layers shown at the left. Not drawn to scale.
Figure 6:
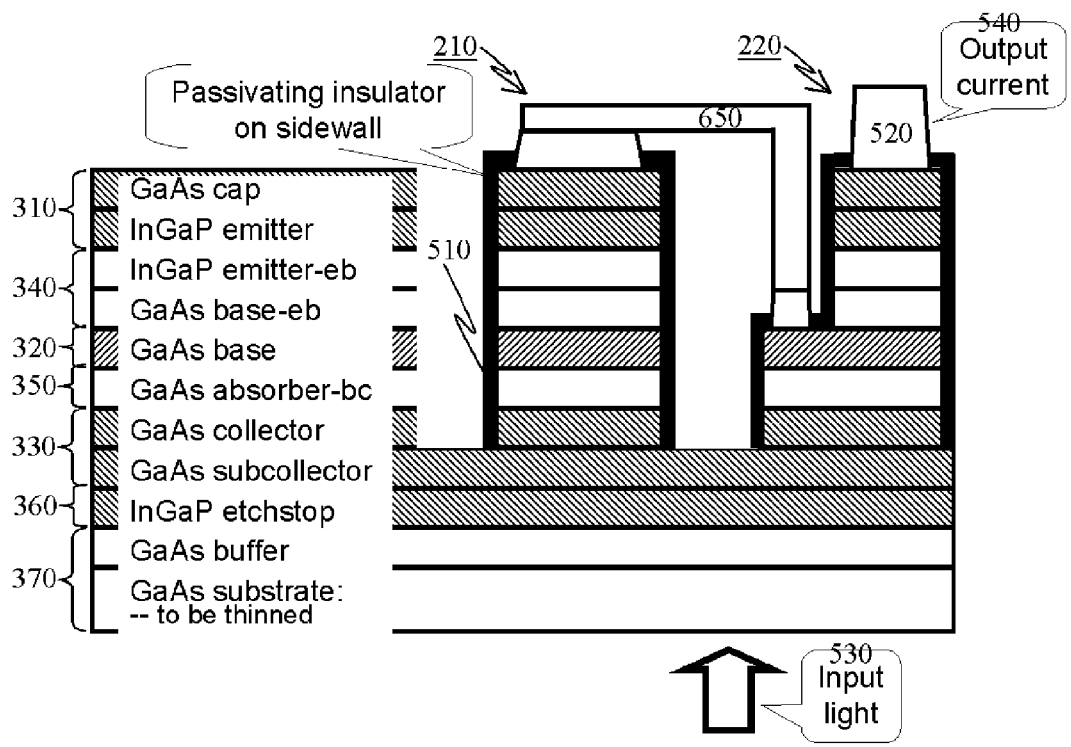
FIG. 6: Cross section of a photo-Darlington pixel with sidewall-passivated mesas shown at the right, and epitaxial layers shown at the left. Not drawn to scale.

In FIGS. 5 and 6, an insulator 510 passivates the mesa sidewalls of both the HPT and the HBT. This insulator can be a high-bandgap semiconductor such as aluminum nitride (AlN). Ohmic metal contacts 520 are made to the emitter of the HPT and the emitter and the base of the HBT. Metal interconnect 650 electrically connects the emitter of the HPT to the base of the HBT, thus forming the photo-Darlington pair in FIG. 6. The input light 530 is detected, transformed and amplified into the output electrical signal 540 of the HPT-based photo-detector array. The optimized epitaxial structures of the HPT for the single-HPT embodiment and for the photo-Darlington embodiment are similar, but slightly different especially in the base layer 320.

Figure 7:
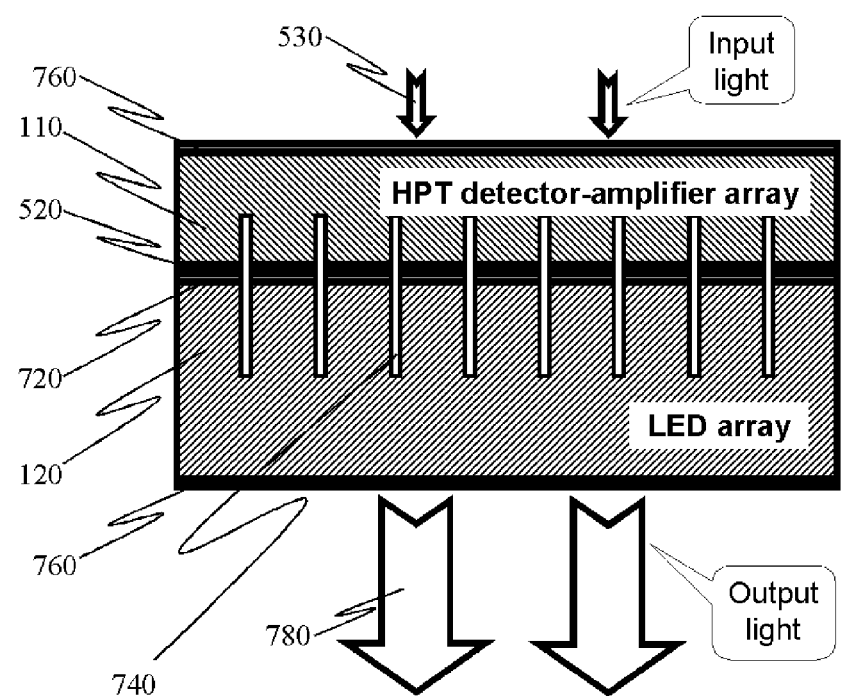

FIG. 7 shows the passivated mesa HPT wafer and the LED display array flip-chip bonded together to form the image intensifier, with optical isolation materials sandwiched in between. The flip-chip bonding of the HPT wafer and the LED wafer needs to achieve micron precision, as compared to the precision of tens of microns of conventional flip-chip bonders. A separate patent application will be filed to cover the precision flip-chip bonding method.

Although not shown in FIG. 7, the passivating insulator is critical and must exist on the mesa sidewalls of the HPT. The Ohmic metal contact 520 of the HPT-based photo-detector array 110 is in physical contact after flip-chip bonding to the Ohmic metal contact 720 of the LED-based display array 120. The optical isolation material 740, together with the contacts metal layers 520 and 720 of sufficient thickness, forms a continuous optical isolation layer between the HPT array and the LED array, significantly suppressing the positive optical feedback from the LED-based display array 120 to the HPT-based photo-detector array 110. Anti-reflection coatings 760 are deposited both on the input surface of the HPT array 110 and on the output surface of the LED array 120. The entire image intensifier amplifies the input optical signal 530, which is typically small but may also span a high dynamic range, into the output optical signal 780, which is typically medium in optical power density, providing enhanced image brightness.

Figure 8:
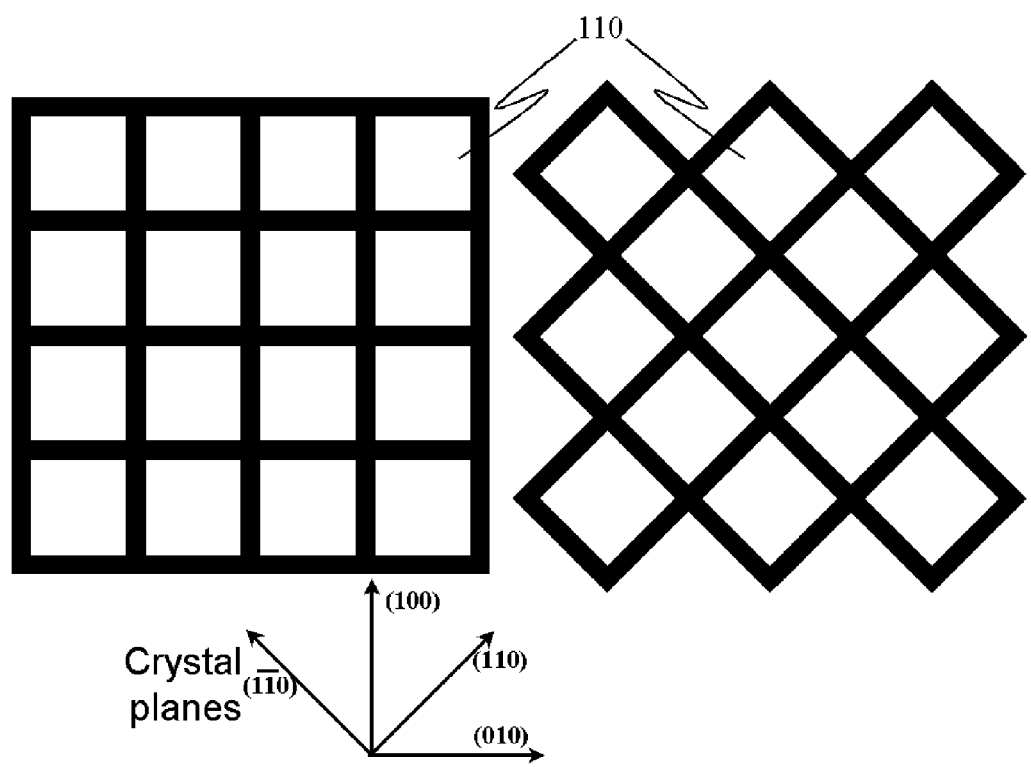
FIG. 8: Planar layout of photodetector array with single HPT pixels, with each square representing one HPT.
Figure 9:
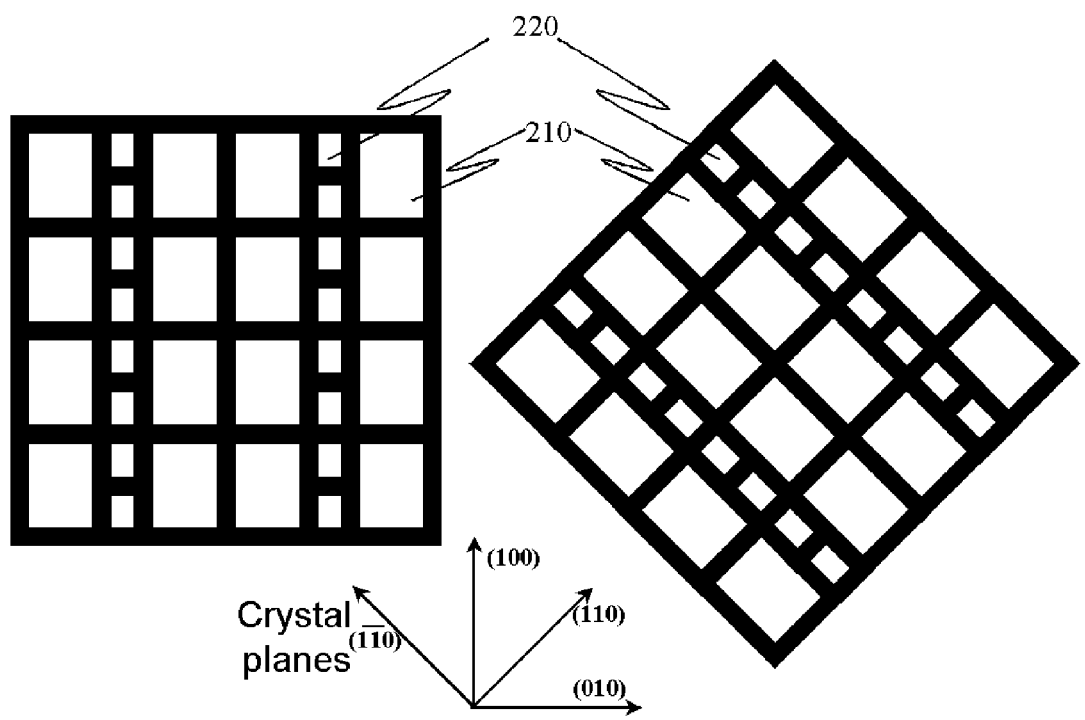
FIG. 9: Planar layout of photodetector array with photo-Darlington pixels, with each large rectangle representing one HPT and each adjacent small rectangle representing its follow-up HBT.

The planar layout of the LED display, however, does not need to be the same as the planar layout of the HPT-based photodetector array, as long as we maintain the one to one correspondence and one to one physical contact between photodetector array pixels and LED array pixels. For optimal sidewall passivation on (001) wafer surface and hence optimal gain and optimal performance, both the HPT and the HBT mesas are rectangular in shape, with sidewalls in the (100) and (010) directions, or with sidewalls in the (110) and (110) directions, as shown in FIGS. 8 and 9. Such designs also ensure very high fill factor for maximum quantum efficiency for optical absorption and detection.

The display array in this invention contains micro-LEDs, as shown in FIG. 7. Recent publications of micro-LED arrays by many groups indicate no quantum efficiency reduction with the small pixel size we will use. The current density levels at which one will operate these LEDs are much lower than their normal operating current density levels. However, the manufacturer's data sheet clearly shows no degradation of quantum efficiency at our low current density levels. In fact, quantum efficiency is reported to increase slightly both for small pixel size (due to enhanced external output efficiency) and for low current density (due to lower temperatures). In short, the micro-LED display chip with small pixel size and low current density is technologically advantageous.

Optical isolation materials, such as metals and light absorbing polymers, must be present between the HPT wafer and the LED wafer, as shown in FIG. 7. The optical isolation layer prevents the formation of the positive feedback loop formed by output light from the display entering the photodetector. Contact metals and light absorbing polymers are such examples. Many polymers have already been developed for light absorption in lithography, holography and liquid crystal display. They are very efficient light absorbers, and they are compatible with standard semiconductor manufacturing processes. Thick metals such as gold, is both a reflector and an absorber. Thick metal is a common step in the processing of many opto-electronics devices such a lasers and photodiodes. The combination of both thick contact metal and polymers provides one of the simplest optical isolation solutions with best performance.

Same as with any other focal plane array (FPA) device, input light is limited to a cone centered on the norm of this image intensifier chip. No input light is parallel to the HPT epitaxial wafer.

For the detection of light in the visible spectrum using GaAs-based materials, the backside of the HPT wafer has to be thinned to several microns, much lower than the carrier diffusion length. This is because GaAs is not completely transparent to visible light, and the GaAs substrate needs to be thinned to within the diffusion length of charged carriers to avoid the loss of quantum efficiency. An epitaxially grown etch-stop layer can control wet chemical etching to the desired thickness.

The focal plane array (FPA) imaging system, which is commonly employed in almost all cameras and in military night vision goggles, is the preferred optics and packaging for the image intensifier in this invention. The weak light from a dim object is collected by the object lens and focused onto its focal plane, where our image intensifier chip is located. Via the internal photoelectric effect, the photodetector converts light into electrical current, which immediately goes into the input of the high-gain current amplifier, whether it is the HPT or the photo-Darlington, the output current of which directly drives the LED, turning electrical currents back into light signals again. The lens in the eyepiece restores the image from the LED display.

Numerous other embodiments may be envisaged, without departing from the spirit and scope of this invention.

What is claimed is:

1. A semiconductor analog photodetector array device contained in a single semiconductor wafer including semiconductor spitaxial layers and having a plurality (>=100) of pixels containing back-illuminated surface-passivated mesa-structure heterojunction-phototransistors (HPTs), wherein both the input optical signal and the output electrical signal are analog instead of digital logic signals, wherein each of the pixels contains at least one heterojunction phototransistor (HPT), wherein said heterojunction phototransistor (HPT) absorbs more than half of the light transmitted into its containing pixel and simultaneously serves as the first-stage amplifier, wherein said heterojunction phototransistor (HPT) forms a mesa structure defined by its surrounding isolation trenches etched into the semiconductor epitaxial layers, wherein said isolation trenches surrounding said mesa significantly reduce electrical crosstalk between said heterojunction phototransistor (HPT) and the rest part of said photodetector array device, wherein all the sidewalls of said heterojunction phototransistor (HPT) mesa are passivated with at least one electrically insulating inorganic passivation material (for example, Al2O3, AlN, Si3N4, SiO2, etc.), and wherein the analog input signal light traverses the semiconductor substrate of said HPT before entering the active layers of said HPT.

2. A device as defined in claim 1, wherein the largest dimension of more than half of said pixels in said photodetector array does not exceed $10\sqrt{2}$ microns $\approx 14.14$ microns).

3. A device as defined in claim 1, wherein each of the pixels contains at least one heterojunction bipolar transistor (HBT) in addition to said heterojunction phototransistor (HPT), wherein said heterojunction bipolar transistor (HBT) absorbs less than half of the light transmitted into its containing pixel, wherein said heterojunction bipolar transistor (HBT) primarily serves as the second-stage high-current amplifier, and wherein the emitter of said heterojunction phototransistor (HPT) is electrically and directly connected to the base of the heterojunction bipolar transistor (HBT), forming a Darlington pair.

4. A device as defined in claim 3, wherein said heterojunction phototransistor (HPT) and said heterojunction bipolar transistor (HBT) are fabricated in a single epitaxial growth step, and wherein said heterojunction phototransistor (HPT) and said heterojunction bipolar transistor (HBT) share the same epitaxial layer or layers for their emitters, the same epitaxial layer or layers for their bases, and the same epitaxial layer or layers for their collectors, respectively.

5. A device as defined in claim 1, wherein said inorganic passivating material for said sidewalls of said heterojunction phototransistor (HPT) mesa contains silicon oxide (SiO2).

6. A device as defined in claim 1, wherein said inorganic passivating material for said sidewalls of said heterojunction phototransistor (HPT) mesa contains either silicon nitride (Si3N4) or a mixture (SiNx) of both silicon (Si) and silicon nitride (Si3N4).

7. A device as defined in claim 1, wherein said inorganic passivating material for said sidewalls of said heterojunction phototransistor (HPT) mesa contains aluminum oxide (Al2O3).

8. A device as defined in claim 1, wherein said inorganic passivating material for said sidewalls of said heterojunction phototransistor (HPT) mesa contains aluminum nitride (AlN).

9. A device as defined in claim 1, wherein the base of said heterojunction phototransistor (HPT) is intentionally doped, but has an active dopant concentration lower than or equal to $10^{(+18)}/cm^3$ (ten to the eighteenth per cubic centimeter).

10. A device as defined in claim 1, wherein the base of said heterojunction phototransistor (HPT) has a width less than or equal to 1000 Angstroms.

11. A device as defined in claim 1, wherein said heterojunction phototransistor (HPT) is a two-terminal device with its base floating, namely, the base is not electrically and directly connected to any metal or any structure other than the emitter and the collector of said heterojunction phototransistor (HPT) itself.

12. A device as defined in claim 1, wherein more than 90% of said sidewalls of said heterojunction phototransistor (HPT) mesa are either parallel or perpendicular to each other within an angular tolerance or error of ±5 degrees of angle.

13. A device as defined in claim 1, wherein the total thickness of the collector layer(s), the sub-collector layer(s) and the wafer substrate of said heterojunction phototransistor (HPT) photodetector is less than or equal to 20 microns.

14. A device as defined in claim 1, wherein the device is used as a two-dimensional focal plane array (FPA).

15. An image intensifying device containing both the phototransistor-based photodetector array as defined in claim 1 and a display array device, wherein each pixel of said display array device contains at least one light emitting diode (LED), wherein said display array device is flip-chip bonded to said photodetector array device wafer with each pixel on said display array electrically and directly connected to one corresponding pixel on said photodetector array, and wherein optical isolation materials capable of reflecting or absorbing light are present in between said display device and said photodetector wafer, substantially preventing the output light from the display from entering the photodetector by means of reflection, absorption or both reflection and absorption.

16. A device containing both the photodetector array as defined in claim 1 and an electrical readout circuit, wherein the electrical readout circuit is flip-chip bonded to said photodetector array, with each pixel on said readout circuit electrically and directly connected to one corresponding pixel on said photodetector array.

17. A device as defined in claim 1, wherein said heterojunction phototransistor (HPT) is made of silicon-based semiconductors, including, but not limited to, Si, Si/Ge and Si/Ge/C.

18. A device as defined in claim 1, wherein said heterojunction phototransistor (HPT) is made of gallium-arsinide-based semiconductors, including, but not limited to, GaAs, AlGaAs, InGaAs, InGaP, and their nitrogen-containing versions.

19. A device as defined in claim 15, wherein said light emitting diode (LED) in said display is made of gallium-arsinide-based semiconductors, including, but not limited to, GaAs, AlGaAs, InGaAs, InGaP, and their nitrogen-containing versions.

20. A device as defined in claim 1, wherein said heterojunction phototransistor (HPT) is made of indium-phosphide-based semiconductors, including, but not limited to, InP, InGaAs, InAlAs, InGaAsP, InAlAsP, InAlGaAs, and their nitrogen-containing versions.

21. A device as defined in claim 1, wherein said heterojunction phototransistor (HPT) is made of gallium-nitride-based semiconductors, including, but not limited to, GaN, AlGaN and InGaN.

22. A device as defined in claim 15, wherein said light emitting diode (LED) in said display is made of gallium-nitride-based semiconductors, including, but not limited to, GaN, AlGaN and InGaN.

* * * * *